US005726918A

United States Patent [19]
Giramma et al.

[11] Patent Number: 5,726,918
[45] Date of Patent: Mar. 10, 1998

[54] TOOL, SYSTEM AND METHOD FOR DYNAMIC TIMING ANALYSIS IN A PLURAL-INSTANCE DIGITAL SYSTEM SIMULATION

[75] Inventors: David J. Giramma; Thomas E. Roth, both of Portland; Oliver W. Kozber, Beaverton, all of Oreg.

[73] Assignee: Synopsys, Inc., Mountain View, Calif.

[21] Appl. No.: 463,881

[22] Filed: Jun. 5, 1995

[51] Int. Cl.⁶ .................................................. G06F 17/50
[52] U.S. Cl. ............................................. 364/578; 364/488
[58] Field of Search ...................................... 364/488, 489, 364/578; 395/500

[56] References Cited

U.S. PATENT DOCUMENTS

| | | | |
|---|---|---|---|
| 4,725,971 | 2/1988 | Doshi et al. | 364/578 |
| 4,787,062 | 11/1988 | Nei et al. | 395/500 |
| 4,827,427 | 5/1989 | Hyduke | 364/489 |
| 4,907,180 | 3/1990 | Smith | 364/578 |
| 4,970,664 | 11/1990 | Kaiser et al. | 364/488 |
| 5,253,363 | 10/1993 | Hyman | 395/800 |
| 5,461,576 | 10/1995 | Tsay et al. | 364/490 |
| 5,469,366 | 11/1995 | Yang et al. | 364/489 |
| 5,475,605 | 12/1995 | Lin | 364/488 |
| 5,508,937 | 4/1996 | Abato et al. | 364/488 |
| 5,581,473 | 12/1996 | Rusu et al. | 364/490 |
| 5,581,738 | 12/1996 | Dombrowski | 364/488 |

OTHER PUBLICATIONS

*From Behavior to Structure: High–Level Synthesis*, Camposano, IEEE Design & Test of Computers, 1990.

Primary Examiner—Vincent N. Trans
Attorney, Agent, or Firm—Kolisch, Hartwell, Dickinson, McCormack & Heuser

[57] ABSTRACT

Described is an invention that provides an efficient selection of timing statements for a logic cell in response to cell pin activity when such cell is implemented as one or more instances of simulator primitives. It does so by defining a first storage structure coupled with a logic processor coupled, in turn to a second storage structure. First storage structure defines plural bitfield arrays corresponding with a cell pin and a possible logic level or state, each bitfield array having an entry for an old or a former state of the pin, a next or new state of that pin and a stable state of that pin and each bitfield array defining an index to one or more memory-based look-up tables defining the number of a timing and/or constraint parameter for the given pin of the logic cell. Such timing parameters describe a delay between two pins of the cell, while such constraint parameters describe timing constraints for the logic cell such as setup times, hold times and minimum pulse width times. In accordance with a preferred embodiment of the invention, a set of rules is enforced by the logic processor during a digital logic simulation run to ensure that appropriate timing and constraint for the logic cell is maintained. Zero-delay timing is used across a collection of instances within a logic cell, thereby to ensure that all timing and constraint analysis is performed at cell boundaries. Timing is evaluated after all simulation activity for a given time frame has ceased, and such is done preferably by scheduling scrubber events that are executed as tasks on a defer queue that is processed at the end of the digital logic simulation activity.

29 Claims, 4 Drawing Sheets

Fig. 5

50 FIRST STORAGE MEANS

PORT A (50a)

| | OLDSTATE | NEWSTATE | STABLESTATE |
|---|---|---|---|
| 0 | 00000001 | 00000010 | 11111100 |
| 1 | 00000010 | 00000001 | 11111100 |
| X | 00000001 | 00000010 | 11111100 |

(50a1, 50a2, 50a3)

PORT B (50b)

| | OLDSTATE | NEWSTATE | STABLESTATE |
|---|---|---|---|
| 0 | 00000100 | 00001000 | 11110011 |
| 1 | 00001000 | 00000100 | 11110011 |
| X | 00000100 | 00001000 | 11110011 |

PORT C (50c)

| | OLDSTATE | NEWSTATE | STABLESTATE |
|---|---|---|---|
| 0 | 00010000 | 00100000 | 11001111 |
| 1 | 00100000 | 00010000 | 11001111 |
| X | 00010000 | 00100000 | 11001111 |

(50c1)

PORT D (50d)

| | OLDSTATE | NEWSTATE | STABLESTATE |
|---|---|---|---|
| 0 | 01000000 | 10000000 | 00111111 |
| 1 | 10000000 | 01000000 | 00111111 |
| X | 01000000 | 10000000 | 00111111 |

PORT Z (50z)

| | OLDSTATE | NEWSTATE | STABLESTATE |
|---|---|---|---|
| 0 | 11111111 | 10101010 | 00000000 |
| 1 | 11111111 | 11111111 | 00000000 |
| X | 11111111 | 01010101 | 00000000 |

TOOL, SYSTEM AND METHOD FOR DYNAMIC TIMING ANALYSIS IN A PLURAL-INSTANCE DIGITAL SYSTEM SIMULATION

TECHNICAL FIELD

The present invention relates generally to digital system simulation. More specifically it concerns digital logic simulators that model the logic values of outputs of objects based upon state abstractions involving the objects' inputs and internal states. By object is meant any discretely modelled logic gate, circuit, board or system of any complexity, although typically an object includes only a few logic gates having relatively few inputs and corresponding outputs.

BACKGROUND ART

Often, digital simulators include a simulation kernel for reading and processing a netlist which consists of a list of simulatable models and the connections between them. Individual models within the logic simulator may describe relatively complex devices such as a field programmable gate array (FPGA) or a complex programmable logic device (CPLD), which typically is used with models of other devices, e.g., memories, microprocessors, etc., to simulate the behavior of the board or system. The simulation kernel performs a conventional event-driven simulation based upon the given description.

The configuration of an FPGA or CPLD is described by a netlist, which identifies each or plural cells, or digital building blocks, used in the design and the connections therebetween. Examples of cells include a 2-input AND gate, a D latch or flip-flop, a 4-input multiplexer (MUX), etc. Each cell has a defined function, which is implied by its name, and a defined timing behavior. The timing behavior for a cell is specified by a set of timing statements that describe how timing is applied to, or constrained by, the cell. A typical timing statement for a flip-flop having multiplexed clock (ClockA, ClockB), data (DataA, DataB) and selection (A/B) inputs and an output (Q) might be "when Q changes in response to a change on DataA, apply a delay of 15 nanoseconds." This statement describes a path delay, which is a delay between two pins. A path delay defines a delay between the time an input pin changes state and the time an output pin responds to the input change.

Another type of timing for a cell describes how the timing is constrained. This is referred to as a timing constraint. A typical timing constraint statement on the multiplexed flip-flop described above would be "the DataA line must be stable for at least 10 nanoseconds prior to ClockA transitioning from a zero to a one when A/B is at a zero." This statement places a limit on the timing behavior of activity that reaches the cell pins. There are several types of timing constraints typically specified for cells, including setup time, hold time and minimum pulse width. A setup time constrains a pin to be stable for a defined amount of time prior to a change on another pin. A hold time constrains a pin to be stable for a defined amount of time after a change on another pin. A minimum pulse width time constrains two consecutive transitions on a pin to occur no closer in time to one another than a defined amount of time.

A cell may be implemented within a simulation kernel as a single instance of a kernel primitive, or as a set of connected primitives, i.e., as a multi-instance cell wherein each instance corresponds to a kernel primitive. In the multiplexed flip-flop example described above, the device manufacturer may describe the cell as one that performs a flip-flop function, but with the clock and data signals multiplexed. The netlist might call out the cell instance by its assigned name and the connections between that cell and other cells in the network. The simulation kernel, on the other hand, might implement the cell as three distinct instances—two MUX's and a flip-flop. Certain cell types would have many path delay and constraint statements. The overall performance of a simulation algorithm is greatly dependent on how efficiently the simulator determines which timing statements apply to a given set of transitions on the pins of a cell. When a cell is implemented as a single instance of a primitive, this analysis can be very time consuming. When a cell is implemented as plural primitives, the complexity of the analysis increases dramatically.

DISCLOSURE OF THE INVENTION

Briefly summarizing the invention, those skilled in the art will appreciate that the invention provides an efficient selection of timing statements for a logic cell in response to cell pin activity when such cell is implemented as one or more instances of simulator primitives. It does so by defining a first data structure or storage means coupled with a logic processor coupled, in turn, to a second data structure or storage means. The first data structure defines plural bitfield arrays corresponding with a cell pin and a possible logic level or state, each bitfield array having an entry for an old or a former state of the pin, a next or new state of that pin, and a stable state of that pin. Each bitfield array defines an index to one or more memory-based look-up tables defining a number of timing and/or constraint parameters for a given pin of the logic cell. Such timing parameters describe a delay between two pins of the cell, while such constraint parameters describe timing constraints for the logic cell such as setup times, hold times and minimum pulse width times.

In accordance with a preferred embodiment of the invention, a set of rules is enforced by the logic processor during a digital logic simulation run to ensure that appropriate timing and constraint for the logic cell is maintained. Zero-delay timing is used across a collection of instances within a logic cell, thereby to ensure that all timing and constraint analysis is performed at cell boundaries. Timing is evaluated after all simulation activity for a given time frame has ceased, and such is done preferably by scheduling scrubber events that are executed as tasks on a defer queue that is processed at the end of the digital logic simulation activity.

These and additional objects and advantages of the present invention will be more readily understood after consideration of the drawings and the detailed description of the preferred embodiment.

BRIEF DESCRIPTION OF THE DRAWINGS

FIG. 5 is a block diagram of a storage means which includes plural bitfield arrays, which storage means implements the preferred embodiment of the present invention.

DETAILED DESCRIPTION OF THE PREFERRED EMBODIMENT AND BEST MODE OF CARRYING OUT THE INVENTION

Figure 1:
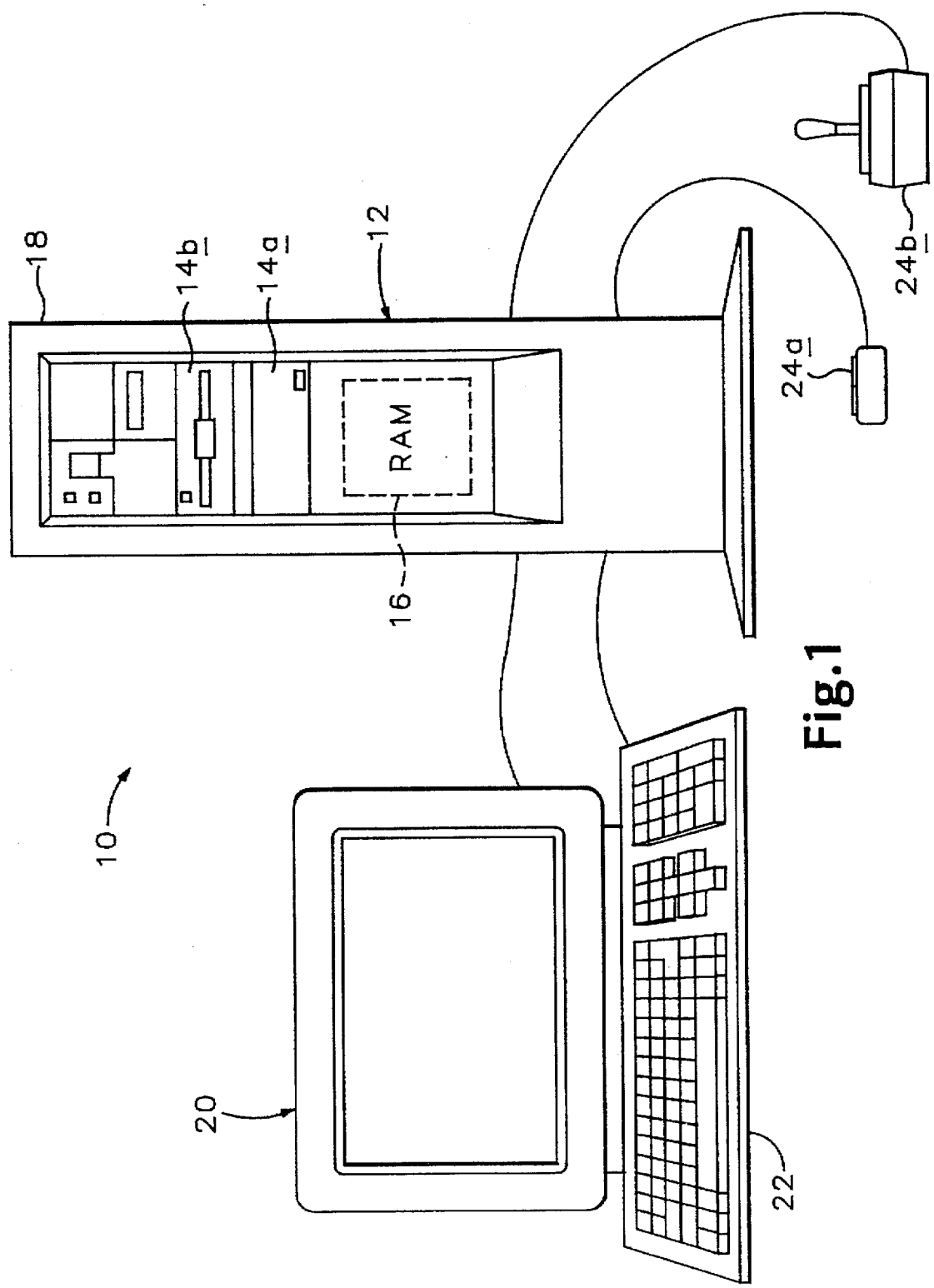
FIG. 1 is a conventional engineering workstation that may act as a hardware/firmware platform for a digital logic simulator and invented method and apparatus which forms a part thereof.

Referring first to FIG. 1, those of skill in the pertinent arts will appreciate that a digital logic simulator typically is a software application executing on an engineering workstation 10 or other general-purpose computer typically providing a digital processor 12 containing an arithmetic logic unit (ALU) and various registers typically including register stacks, scratchpad memories and accumulators. Skilled persons also will appreciate that the workstation also typically will provide for mass data storage, e.g., a hard or flex disk drive 14a, 14b, or both, as well as a quantity of read-and-write semiconductor memory (RAM) 16 (shown in outline as residing within workstation 10 and its housing 18) in which such application programs reside for execution by processor 12. Finally, skilled persons will appreciate that the workstation also typically will provide a display means such as a video display terminal (VDT) 20, a keyboard 22 and an associated display cursor control system 24 including, for example, a mouse or joystick 24a, 24b, or both. Within the spirit and scope of the invention, such a workstation may be equipped with specialized hardware that accelerates the digital logic simulation process, or the digital logic simulator itself may be a special-purpose processor that is a combination of hardware and firmware dedicated to the task of digital logic simulation. All such conventional hardware, firmware and software-executing-on-a-hardware/firmware platform architectures for a digital logic simulator are contemplated, and all are within the spirit and scope of the invention.

The invention provides a tool, system and method which provides for the efficient selection of timing statements for a cell in response to cell pin activity when that cell is implemented as one or more instances of simulator primitives. It will be appreciated by those of skill in the art, that the invention provides an approach to cell timing evaluation which allows path delay (or output-to-output) and constraint timing to be applied to cells of arbitrary size and internal complexity, thus greatly improving productivity in generating accurate cell descriptions.

The invention will be described, for illustrative purposes only, in the context of a logic cell shown generally at 30 in FIG. 2 where it may be seen that cell 30 includes internally thereof plural primitives 32, 34, and 36, the former two being AND gates which are interconnected with the latter OR gate. Plural cell pins A, B, C, and D (the input pins), and Z (the output pin) are provided at the boundary of cell 30 and may be interconnected with other logic cells in the digital logic simulation. It will be understood that cell 30 may be of any size and contain any number of interconnected primitives.

Figure 2:
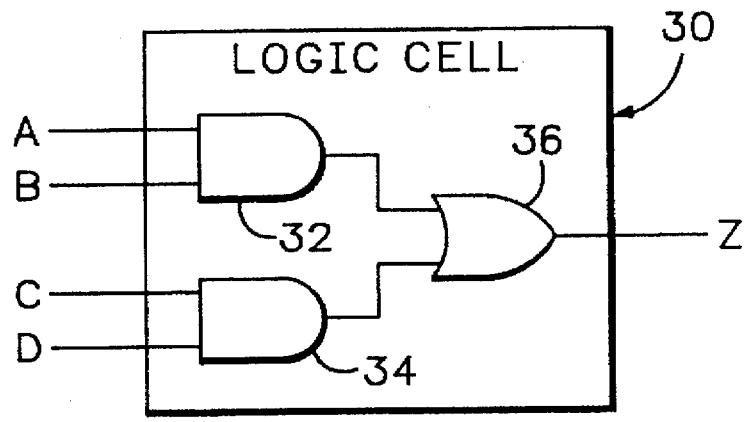
FIG. 2 is a schematic diagram of a digital logic cell illustrative of three interconnected primitives capable of being analyzed in accordance with the preferred embodiment of the invention.
Figure 3:
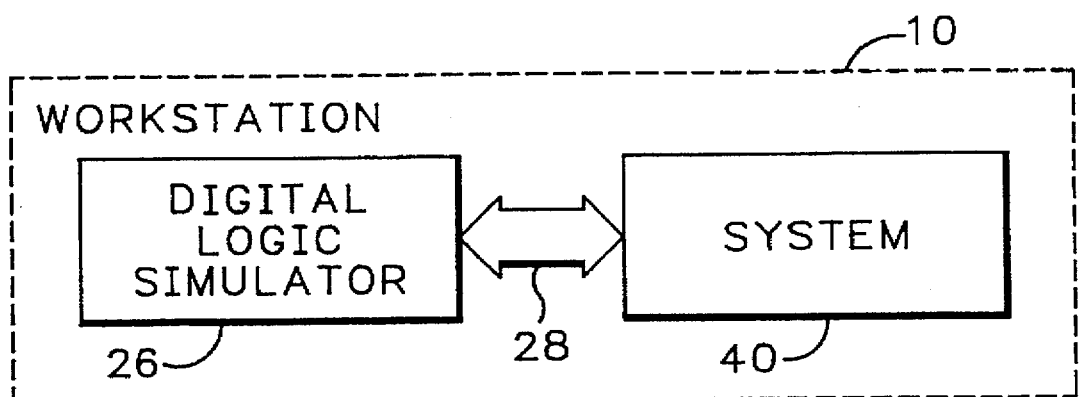
FIG. 3 is a schematic system block diagram showing the hardware/firmware platform for a digital logic simulator and a system for performing timing analysis in accordance with a preferred embodiment of the invention.

Turning next to FIG. 3, work station 10 is illustrated in block diagram form where it may be seen that a digital logic simulator 26 is operatively connected via connector 28 to an embodiment of the present system, indicated at 40. Generally speaking, system 40 provides a tool for efficiently determining, and subsequently providing timing statements to simulator 26, which statements characterize the timing characteristics of cell 30 (FIG. 2), in response to cell pin activity when that cell is implemented as one or more instances of simulator primitives.

Figure 4:
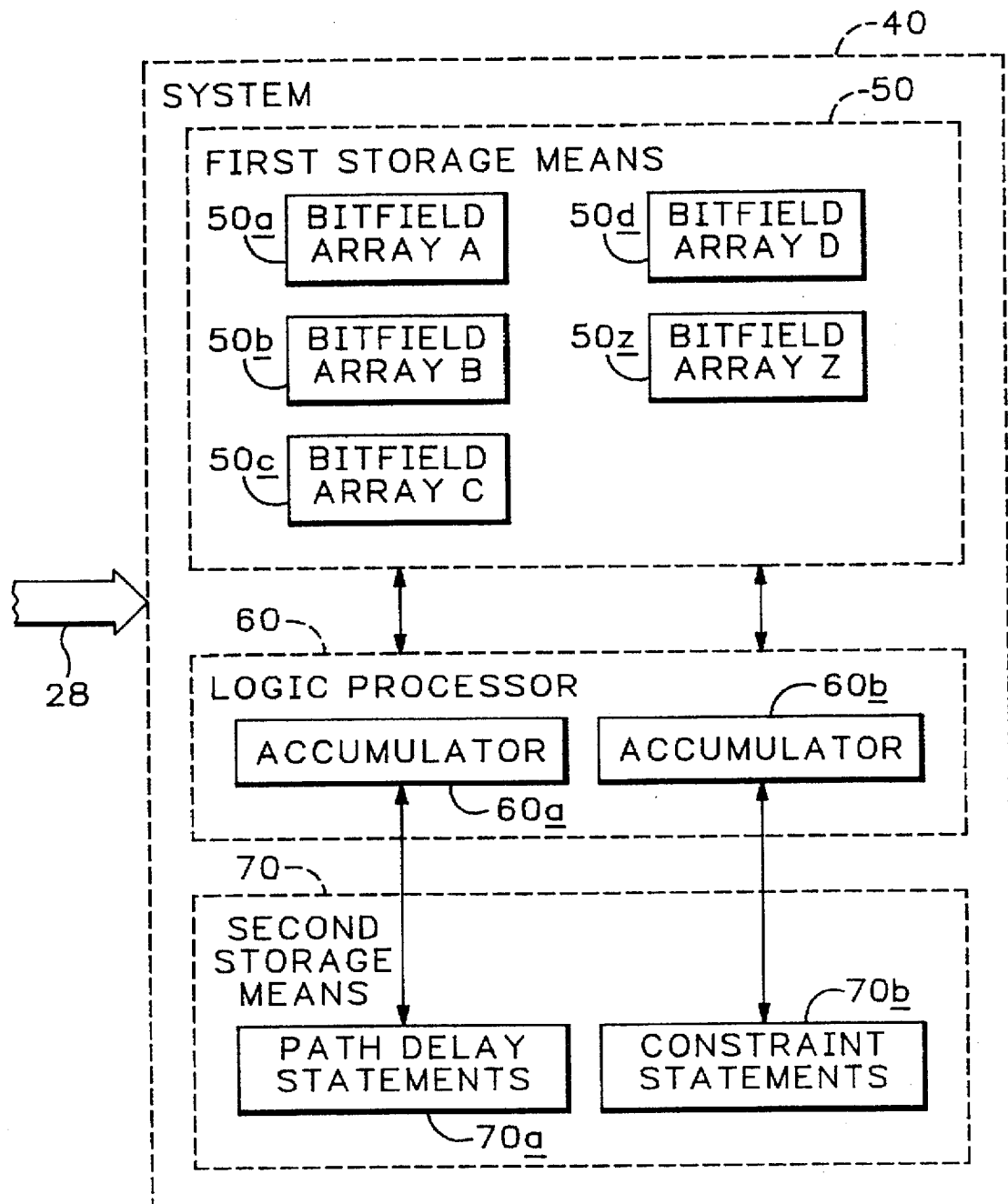
FIG. 4 is a schematic system block diagram showing the invention made in accordance with its preferred embodiment.

System 40 is shown in more detail in FIG. 4 where it may be seen to include a first storage means or data structure 50 operatively coupled to a logic processor 60, which is in turn, operatively coupled to a second storage means or data structure 70. First and second storage means 50, 70 may be any suitable storage means implementable in any suitable hardware, firmware, or software. Logic processor 60 may be any suitable arithmetic logic unit or equivalent, or software-programmed sub-routine.

First storage means 50 may be seen to include plural bitfield arrays 50a through 50d, and 50z. It will be appreciated that each bitfield array corresponds to a cell pin in FIG. 2, e.g., array 50a corresponds to pin (port) A, array 50b corresponds to pin (port) B, . . . , and array 50z corresponds to pin (port) Z.

Storage means 50 is shown in more detail in FIG. 5 wherein each of the bitfield arrays may be seen to include plural bitfields sets. The bitfield sets for each bitfield array will be described in conjunction with array 50a, it being understood that each bitfield array is similarly configured.

Referring now to bitfield array 50a in FIG. 5, the reader will observe that bitfield sets $50a_1$, $50a_2$, and $50a_3$ comprise the array. Each bitfield set will be seen to correspond to a logic level which may be achieved by a given pin. In this example, there are three logic levels or states: logic 0, logic 1, and X for unknown. It will be understood however that any number of logic levels or states may be defined by a bitfield set, and that the three logic levels described above are intended for illustrative purposes only and are not intended to limit the invention or application thereof. As shown, bitfield set $50a_1$ corresponds to logic level 0, bitfield set $50a_2$ corresponds to logic level 1, and bitfield set $50a_3$ corresponds to logic level X. Each bitfield set may be seen to include three bitfields. For each logic state which may be achieved by a pin, there is a bitfield which corresponds to: (1) the old or former state of that pin, e.g., OldState, (2) the new state of that pin, e.g., NewState, and (3) the stable state of that pin, e.g., StableState. For example, the bitfield that represents an old state of logic 0 for pin A is 00000001. A bit in a particular bitfield is a logic 1 when a corresponding timing statement would be selected under that state/type condition which is described in more detail below.

Skipping ahead to a discussion of second storage means 70, it will be understood, as shown in FIG. 4, that timing statements for a particular cell may be categorized as either path delay (output-to-output) statements 70a or constraint statements 70b. Path delay statements, as mentioned above, describe the delay between two pins or outputs and may be referred to as the pin-to-pin delay. Constraint statements describe how timing is constrained for the cell and include such constraints as setups, holds, and minimum pulse widths. These statements are stored in computer-accessible memory, represented by storage means 70.

As shown in FIG. 4, path delay and constraint statements comprise two separate groups. In the present embodiment, path delay and constraint statements are assigned an ordinal number, starting with zero. The ordinal number may be considered each timing statement's unique designator or identifier. For example, the path delay statements for logic cell 30 of FIG. 2 might be characterized by the following timing statements of TABLE 1:

Timing Statements (0) ARISE: tpD from A(L1) to Z(AH)

(1) AFALL: tpD from A(HO) to Z(AL)

(2) BRISE: tpD from B(L1) to Z(AH)

(3) BFALL: tpD from B(HO) to Z(AL)
(4) CRISE: tpD from C(L1) to Z(AH)
(5) CFALL: tpD from C(HO) to Z(AL)
(6) DRISE: tpD from D(L1) to Z(AH)
(7) DFALL: tpD from D(HO) to Z(AL)

It will be understood that the path delay statements for logic cell 30 of FIG. 2 further might be characterized by the following state keys of TABLE 2:

State Keys

0—Logic 0
1—Logic 1
X—Logic X
H—Logic 1,X
L—Logic 0,X

In the above TABLES 1 and 2, it will be appreciated that statement (0) corresponds to ARISE, statement (1) corresponds to AFALL, etc. . . . Furthermore, although the constraint statements are not specifically described in as much detail as the path delay statements, each is similarly organized and managed in simulator-accessible memory.

The reader will observe that for each pin of the logic cell (A-D, Z), each bitfield is constructed of plural bits, where the number of bits in a bitfield corresponds to the number of timing statements. Each of the bits in a bitfield has an ordered value which corresponds to the bit's position. For example, as shown in FIG. 5, a logic 1 value appears in the bit-0 position in array 50a for a state in which OldState equals logic 0. All of the other bit positions are logic 0. That is, bit-1 through bit-7 are all logic 0. In the above example, each bitfield in each bitfield array in FIG. 3 includes eight bits. The above table, which may be referred to herein as a memory-based look-up table, indicates eight timing statements. Each bit in a bitfield corresponds to a particular timing statement. More specifically, the ordered value of each bit, e.g., the bit's position, corresponds to a timing statement designator or identifier. A bit in a particular bitfield is a logic 1 when the corresponding timing statement, (by virtue of its designator), would be selected under that state/type condition. The rules for setting a bit (or statement bit) to a logic 1 for a given port and state in each of the three conditions (logic states) are as follows:

OldState:=if the statement calls for the old state of the pin to be at that state;
NewState:=if the statement calls for the new state of the pin to be at that state, and the old state is not equal to the new state; and
StableState:=if the statement calls for the pin to be at that state and unchanging.

By way of example, it will be appreciated that Statement (4) from TABLE 1 is selected under a condition that pin C transitions from a logic 0 to a logic 1, and pin Z also transition from a logic 0 to a logic 1. As shown in FIG. 5 at bitfield array 50c, bitfield set $50c_1$ for pin C thus sets the bit-4 position to a '1' for OldState at logic 0, '1' for NewState at logic 1, and '0' for StableState at logic 0, 1, and X. Since only Statements (4) and (5) call for any change on pin C, the only OldState or NewState bits that are ever set for that port are bit-4 and bit-5. Likewise, the StableState bits are always set to logic 1 for pin C, except for bits 4 and 5. Application of this logic to each of the timing statements enables the construction of the bitfields arrays for each pin. It will be understood that the above-described methodology for creating the bitfields is used for illustrative purposes only, and that other methodologies are within the spirit and scope of the invention.

Shifting attention to FIG. 4 for a moment, the reader will observe that logic processor 60 includes two so-called accumulators 60a, 60b. Processor 60 is operatively coupled to first storage means 50 and second storage means 70. It may also be seen that accumulator 60a is associated with path delay statements 70a, and that accumulator 60b is associated with constraint statements 70b.

An accumulator or logic processor is an array which is indexed according to the ordinal number of each pin. Each accumulator contains or holds the bitfield value for the current status of that pin. In the processor, each pin is classified as either an UPDATE pin or an EVALUATE pin according to how it manipulates the processor. When an UPDATE pin changes state, it loads the accumulator with the StableState bitfield for the new state retrieved from storage means 50. When an EVALUATE pin changes state, it loads the accumulator with a bitfield value retrieved in part from storage means 50 that indicates the transition made by the pin. Subsequently, the processor evaluates the bitfield values in the accumulator to determine which timing statements match current conditions. The bitfield values in each accumulator 60a, 60b are evaluated by processor 60 to determine which timing statements, whether they be path delay and/or constraint statements match current conditions.

When an EVALUATE pin changes in value from a state A to a state B, the bitfield value or values in the processor (or accumulators) corresponding to the changed pin is (are) loaded with the value ChangeValue, where ChangeValue is arrived at by the bitwise logic combination of Assign Statement 1:

ChangeValue (A→B)=(OldState(A) & NewState(B))|StableState(B), where "&" denotes a bitwise AND operation, and "|" denotes a bitwise OR operation. Next, the processor creates a result bitfield by performing a bitwise AND of all of the entries in the processor array (accumulator). The position of every bit in the result bitfield which is a logic 1 corresponds to a timing statement designator that is selected by the current status of each pin.

By way of example and with reference to FIGS. 2 and 5, assume that A=1, B=1, D=1, and C changes from logic 1 to logic 0, resulting in Z changing from logic 1 to logic 0. From the bitfield arrays in FIG. 5, and the above discussion, it will be appreciated that since pin C has changed value, the processor will be loaded with ChangeValue(1→0) for pin C, which, when calculated as set forth above, will be a bitfield having a value 11101111. Similarly, the processor value for pin Z, according to the ChangeValue operation described above will be a bitfield value 10101010.

The value of all of the pins of the cell are set forth immediately below in

TABLE 3

| Pin A | StableState(1) | 11111100 |
|---|---|---|
| Pin B | StableState(1) | 11110011 |
| Pin C | ChangeValue(1——>0) | 11101111 |
| Pin D | StableState(1) | 00111111 |
| Pin Z | ChangeValue(1——>0) | 10101010 |
| Result | A & B & C & D & Z | 00100000 |

Performing a bitwise AND of all of the processor values produces a result bitfield having a value 00100000. It will be appreciated that because the bit-5 position is a logic 1 in the result bitfield, Timing Statement (5) (wherein the 5 may be understood to be an index pointing at the corresponding memory-based look-up table entry) corresponding the CFALL statement will be selected.

It will be appreciated by those of skill in the art that the above method is applied to both path delay and constraint timing, the difference being that the EVALUATE pins for constraints are the input pins which trigger a timing check, e.g., the clock pin on a cell with setup timing statements. That is, when an EVALUATE pin changes state for a constraint statement, a timing check is triggered to determine whether there has been a violation of a set up time or the like.

One of the fundamentally novel aspects of the present invention is that the timing analysis described above is extended to support timing across a collection of instances in a cell. In order to do so, all instances internal to the cell are simulated in zero delay. Zero delay means that the simulation operates without modeling real time delay, treating the real time delay as if it were zero. As an example, when a stimulus event occurs at time 't' on an input which is connected directly through combinational logic to an output, the response event on that output will be reported as occurring at time 't'. By doing so, all timing and constraint analysis is performed at the cell boundary. Instances are placed into the simulation network which correspond to the pins or ports of the cell, and when those objects are processed during simulation, they perform the timing algorithm, rather than a single instance itself performing the algorithm. As with the algorithm discussed above, when a state change is processed by a cell pin object, the appropriate accumulator is updated to reflect that the pin is changing, e.g., the ChangeState value is loaded into the accumulator. Evaluating pins however do not immediately process the accumulator to determine timing.

Because the effect of an input pin change is not immediately apparent when the instances attached to that pin are evaluated, timing cannot be properly evaluated until after all simulation activity for that time has ceased. This is because when an input changes, the resulting functional changes may need to propagate through multiple levels of logic in 0-delay. In order to account for the propagation delays, cell pins schedule special zero delay events or so-called scrubber events, whenever they change state. These events are scheduled onto a special time queue or defer queue which is not processed until all other simulation activity has completed for that time. This ensures that all input and output pin changes will be reflected in the accumulator values regardless of the complexity of the cell implementation.

The scrubber events initiate two activities: first, for EVALUATE pins, they perform the timing evaluation algorithm and take the appropriate resultant action; second, for all pins, they reset the accumulator value to the StableState value which ensures that when the next cell pin changes state at some future time, the only accumulator value which needs to be updated is the one for the changing pin.

Accordingly, while the present invention has been shown and described with reference to the foregoing preferred method and apparatus, it will be apparent to those skilled in the art that other changes in form and detail may be made therein without departing from the spirit and scope of the invention as defined in the appended claims.

We claim:

1. For use with a logic simulator wherein one or more defined logic cell(s) contain(s) plural interconnected primitives, a method for performing timing analysis on pins at the boundary of the cell, said method comprising the steps of:

defining plural bitfields for each pin at the boundary of the cell, each of plural bits of which corresponds with a timing parameter of the cell, with a first bitfield representing the timing parameters associated with a former state of a given pin, with a second bitfield representing the timing parameters associated with a present state of the given pin that is different from the former state of the given pin, and with a third bitfield representing the timing parameters associated with a stable state of the given pin; and producing a bitwise logic combination of such plural bitfields for a selected one or more of the pins; and determining the timing of state changes of the pins based upon such logic combination.

2. The method of claim 1 which further comprises the step of deferring said determining step to accommodate propagation delays through the plural interconnected primitives to the pins at the boundary of the cell.

3. The method of claim 1 wherein said determining step includes evaluating the produced logic combination in order to determine any timing violations.

4. A timing analysis tool for use with a logic simulator for performing timing analysis on pins at the boundary of a logic cell which contains plural interconnected primitives comprising:

means for storing timing statements corresponding to each pin at the boundary of the cell;

bitfield means which include a bitfield array associated with each pin, wherein each array includes plural bits grouped into bitfields and wherein the bitfields are organized into bitfield sets wherein each set corresponds to a logic state that a pin may achieve, and further wherein each bitfield set includes a bitfield associated with a former state of a given pin, a bitfield associated with a present state of a given pin, and a bitfield associated with a stable state of a given pin;

means for performing bitwise logic combinations of the bitfields for a selected one or more of the pins to produce a bitfield result; and means for selecting timing statements according to the bitfield result and determining the timing of state changes of the pins.

5. The tool of claim 4 which further comprises means for deferring the selection of timing statements to accommodate propagation delays through the plural interconnected primitives at the boundary of the cell.

6. The tool of claim 5, wherein said means for deferring includes a task queue for scheduling said deferring step for execution at a definedly later time.

7. The tool of claim 4, wherein said means for storing timing statements includes a data structure wherein each timing statement is indexed with a designated value.

8. The tool of claim 7, wherein the timing statements include at least one statement which characterizes an output-to-output delay.

9. The tool of claim 7, wherein the timing statements include at least one statement which characterizes a constraint.

10. The tool of claim 9, wherein the constraint is a set up time which constrains a pin to be stable for a defined amount of time prior to a change on another pin.

11. The tool of claim 9, wherein the constraint is a hold time which constrains a pin to be stable for a defined time after a change on another pin.

12. The tool of claim 9, wherein the constraint is a minimum pulse width which constrains two consecutive transitions on a pin to occur no closer than a defined amount of time.

13. The tool of claim 4, wherein said bitfield means includes a data structure.

14. The tool of claim 4, wherein said means for performing bitwise logic combinations includes a logic processor operatively coupled to the bitfield means, said logic processor being capable of being loaded with selected bitfield values.

15. The tool of claim 4, wherein said means for selecting timing statements includes a memory-based look-up table containing one or more such timing statements each having associated therewith a table index by which such timing statements may be selected.

16. In a logic simulator wherein one or more defined logic cells include(s) cell pins at the boundary thereof, and contain(s) one or more interconnected primitives, a method for selecting timing statements which characterize a particular cell's timing behavior comprising the steps of:

storing plural timing statements in simulator-accessible memory, wherein each timing statement has a designated value;

defining plural bitfields for each cell pin wherein each bitfield includes plural bits which correspond to the timing statements, and further wherein each logic state which may be achieved by a pin is characterized by a set of bitfields which include a bitfield associated with a former state of a given pin, a new state of the given pin, and a stable state of the given pin;

processing bitfield values to determine a result bitfield value which corresponds to one or more of the timing statements; and deferring processing of selected bitfields, when a cell pin changes state, until after the completion of all simulation activity in a cell for a given time.

17. The method of claim 16, wherein said processing step is performed by a logic processor which holds a bitfield value for each pin associated with the pin's current status, and is capable of performing bitwise logic combination of such plural bitfield values to arrive at the result bitfield.

18. The method of claim 17, wherein said processing step includes the step of classifying each pin as either an update pin, in which case the logic processor is loaded with the stable state bitfield value for the new state, or an evaluate pin, in which case the logic processor is loaded with a bitfield value which indicates the transition made by the pin.

19. The method of claim 18, wherein said deferring step is accomplished at least in part by defining a time queue and scheduling a 0-delay event onto the queue when a cell pin changes state.

20. The method of claim 19, wherein said time queue is processed by the logic processor after all other simulation activity for a cell is completed.

21. The method of claim 16, wherein there is a one-to-one correspondence between the number of bits in a bitfield and the number of timing statements.

22. In a logic simulator wherein one or more defined logic cell(s) include cell pins at the boundary thereof, and contain(s) one or more interconnected primitives, a method for selecting timing statements for the logic simulator which characterize a particular cell's timing behavior comprising the steps of:

storing plural timing statements in simulator-accessible memory, wherein each timing statement has a designator;

defining plural bitfields for each cell pin wherein each bitfield includes plural bits having ordered values, wherein each ordered value corresponds to a timing statement designator, and further wherein each logic state which may be achieved by a pin is characterized by a set of bitfields which include a bitfield associated with a former state of a given pin, a new state of the given pin, and a stable state of the given pin;

processing selected bitfields to determine a result bitfield which includes one or more bits set to a pre-defined value; and selecting the timing statements whose designators match the ordered value of the bits which have been set to the pre-defined value in the result bitfield.

23. The method of claim 22, wherein said processing step is performed by a logic processor capable of performing bitwise logic combination of the selected bitfields.

24. The method of claim 23 wherein said processing step includes the step of classifying each pin as either an update pin, in which case the logic processor is loaded with the stable state bitfield value for the new state, or an evaluate pin, in which case the logic processor is loaded with a bitfield value which indicates the state transition made by the pin.

25. The method of claim 24, wherein the bitfield value for an evaluate pin includes the product of a bitwise AND of the bitfield values of the former state of a pin and the new state of the state to which the pin transitioned, and the subsequent bitwise OR of that product and the bitfield value for the stable state of the state to which the pin transitioned.

26. The method of claims 24 or 25, wherein the result bitfield is defined by the bitwise AND of all bitfield values in the logic processor.

27. A timing analysis system for use with a logic simulator for performing timing analysis on pins at the boundary of a logic cell which contains one or more primitives comprising:

a first data structure for storing plural bitfield arrays wherein each array corresponds to a cell pin and is characterized by having at least one bitfield set which corresponds to a logic state which may be achieved by the corresponding pin, and wherein each bitfield set includes a bitfield associated with the former state of the pin, a bitfield associated with the present state of the pin, and a bitfield associated with the stable state of the pin;

a processor operatively coupled to the first data structure for receiving selected bitfield values and performing bitwise logic combination of such selected values; and a second data structure operatively coupled to the processor for storing timing parameters selectable by the processor for use by the logic simulator.

28. The system of claim 27, wherein said second data structure includes timing parameters related to the path delay between cell pins.

29. The system of claim 27, wherein said second data structure includes timing parameters related to timing constraints of the cell pins.

* * * * *